(12) United States Patent
Boesser et al.

(10) Patent No.: US 7,551,296 B2
(45) Date of Patent: Jun. 23, 2009

(54) METHOD FOR DETERMINING THE FOCAL POSITION OF AT LEAST TWO EDGES OF STRUCTURES ON A SUBSTRATE

(75) Inventors: Hans-Artur Boesser, Breidenbach (DE); Wolfgang Fricke, Netphen (DE); Klaus-Dieter Adam, Jena (DE)

(73) Assignee: Vistec Semiconductor Systems GmbH, Weilburg (DE)

( * ) Notice: Subject to any disclaimer, the term of this patent is extended or adjusted under 35 U.S.C. 154(b) by 0 days.

(21) Appl. No.: 12/040,872

(22) Filed: Mar. 1, 2008

(65) Prior Publication Data

US 2008/0252903 A1 Oct. 16, 2008

(30) Foreign Application Priority Data

Apr. 12, 2007 (DE) .................. 10 2007 017 649

(51) Int. Cl.
*G01B 11/14* (2006.01)
(52) U.S. Cl. ...................................... 356/614; 356/624
(58) Field of Classification Search ............ 356/614, 356/601, 622, 624, 625–640, 237.1–237.6, 356/239.1–239.8, 394; 250/559.29, 559.36, 250/559.39, 559.45; 359/379–382; 382/172, 382/284, 286, 145–152, 181, 190, 199, 219
See application file for complete search history.

(56) References Cited

U.S. PATENT DOCUMENTS

| 5,153,916 | A * | 10/1992 | Inagaki et al. | 382/151 |
| 6,865,288 | B1 * | 3/2005 | Shishido et al. | 382/145 |
| 6,924,900 | B2 | 8/2005 | Rinn | |
| 2002/0196331 | A1 | 12/2002 | Rinn | |
| 2004/0008877 | A1 * | 1/2004 | Leppard et al. | 382/141 |
| 2007/0069106 | A1 * | 3/2007 | Krief et al. | 250/201.3 |
| 2007/0070336 | A1 * | 3/2007 | Maeda et al. | 356/237.2 |

* cited by examiner

*Primary Examiner*—Gregory J Toatley, Jr.
*Assistant Examiner*—Tri T Ton
(74) *Attorney, Agent, or Firm*—Houston Eliseeva LLP

(57) ABSTRACT

A method for determining the focal position of at least two edges of structures (31) on a substrate (30) is disclosed. During the movement of a measurement objective (21) in the Z-coordinate direction, a plurality of images of the at least one structure (31) is acquired with at least one measurement window (45) of a detector. An intensity profile of the structure (31) is determined for each image.

13 Claims, 7 Drawing Sheets

METHOD FOR DETERMINING THE FOCAL POSITION OF AT LEAST TWO EDGES OF STRUCTURES ON A SUBSTRATE

RELATED APPLICATIONS

This application claims priority to German Patent Application No. 10 2007 017 649. 1, filed on Apr. 12, 2007, which is incorporated herein by reference in its entirety.

FIELD OF THE INVENTION

The present invention relates to a method for determining the focal position of at least two edges of at least one structure on a substrate.

BACKGROUND OF THE INVENTION

German patent application no. 10 129 818.8 discloses a method for reading out a detection chip of an electronic camera in a coordinate measuring device for determining the position of an edge of a structure on a substrate. The detection chip is associated with at least two digitization means, each associated with individual pixels of the detection chip. The method allows an equalization of the reduced digitized data of the various digitization means by means of a correction function so that the edges to be detected appear equalized.

German patent application no. DE 10 131 508 discloses a method and a microscope for detecting an object with a light source illuminating the object and an imaging system imaging the object onto a detector. In order to enhance the effective resolution of the imaging system going beyond the limits of the resolution determined by the properties of the imaging system, the method and the microscope for detecting an object are characterized in that the object is detected several times with different resolutions of the imaging system and that the detected image data are subjected to a statistical and/or numerical evaluation for determining an optimized resolution.

SUMMARY OF THE INVENTION

It is the object of the present invention to further improve the measurement repeatability and the measurement accuracy of a coordinate measuring machine.

This object is achieved by a method including the features of claim 1. At least the focal position of two edges of at least one structure on a substrate is to be determined.

For the inventive method, it is particularly advantageous if, during the movement of a measurement objective in the Z-coordinate direction traversing a plane with optimal focus, a plurality of images of the at least one structure is acquired with at least one measurement window of a detector and an intensity profile of the structure is determined for each image. Simultaneously, the Z-position is determined for each image. Next, a contrast value is determined for each acquired image and for each acquired edge of the structure in the measurement window based on the acquired intensity profile. The position of the optimal focus in the Z-coordinate direction is determined for each edge from the contrast values, wherein the contrast is maximal for this edge.

The substrate itself is located on a table movable in a plane created by the X-coordinate direction and the Y-coordinate direction.

The maximum contrast value and thus the Z-position at which the maximum contrast for an edge is achieved is determined by an analytic function fitted to the measurement points.

The analytic function is determined by a fit to the measurement points, and the Z-position for the optimal focus is determined based on the fit. The fit with which the Z-position is determined at which the concerned structure was in focus may be a polynomial fit. It may also be any other analytic function representing the measurement value behavior.

The position of the measurement objective in the Z-coordinate direction may be measured by a glass scale. It is also contemplated that the position of the measurement objective in the Z-coordinate direction is determined by a laser metering system or any other suitable measuring system.

The movement of the measurement objective in the Z-coordinate direction covers a multiple of the depth of focus area of the measurement objective. The movement of the measurement objective in the Z-coordinate direction includes the depth of focus area and, during the movement, passes at least once the optimal focal position of the measurement objective with respect to the structure currently to be measured or examined.

At least one first measurement window is provided. Several measurement windows may differ in orientation. For each edge of the structure, a position in the image is determined in the respective measurement window based on the intensity profile.

During the image acquisition, the position of the edge in the image is determined, wherein at the same time a reference position ($X0$, $Y0$) in the plane created by the X-coordinate direction and the Y-coordinate direction is determined for each image. The edge position in the image and the reference position may be added to obtain a structure edge position. A functional relationship between the edge positions of the structure and the Z-positions is determined by a fitted position, wherein the positions of the several edges are each determined by means of the point of intersection of the position for the optimal focus and the respective functional relationship of the positions of the various edge positions of the structure. For structure width measurements (CD) and overlay measurements, the determination of the reference position is not obligatory, but it can be used for the evaluation. Overlay data result from structures that are interlaced with each other or where one structure lies partially over the other.

The reference position in the plane created by the X-coordinate direction and the Y-coordinate direction may be the position of the image center of the image window of the detector. A direct, stationary reference to the image or the image detector is necessary.

The intensity profiles near the depth of focus area are evaluated such that intensity levels of 0% and 100% are determined.

The substrate is a mask or a wafer. The detector may be designed as a CCD camera.

The method may be advantageously used in means for determining the position of the structure on the substrate. By using the method in the means, the structure width of the structure may be determined. It is also possible to determine the overlay data of the structure on a substrate.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
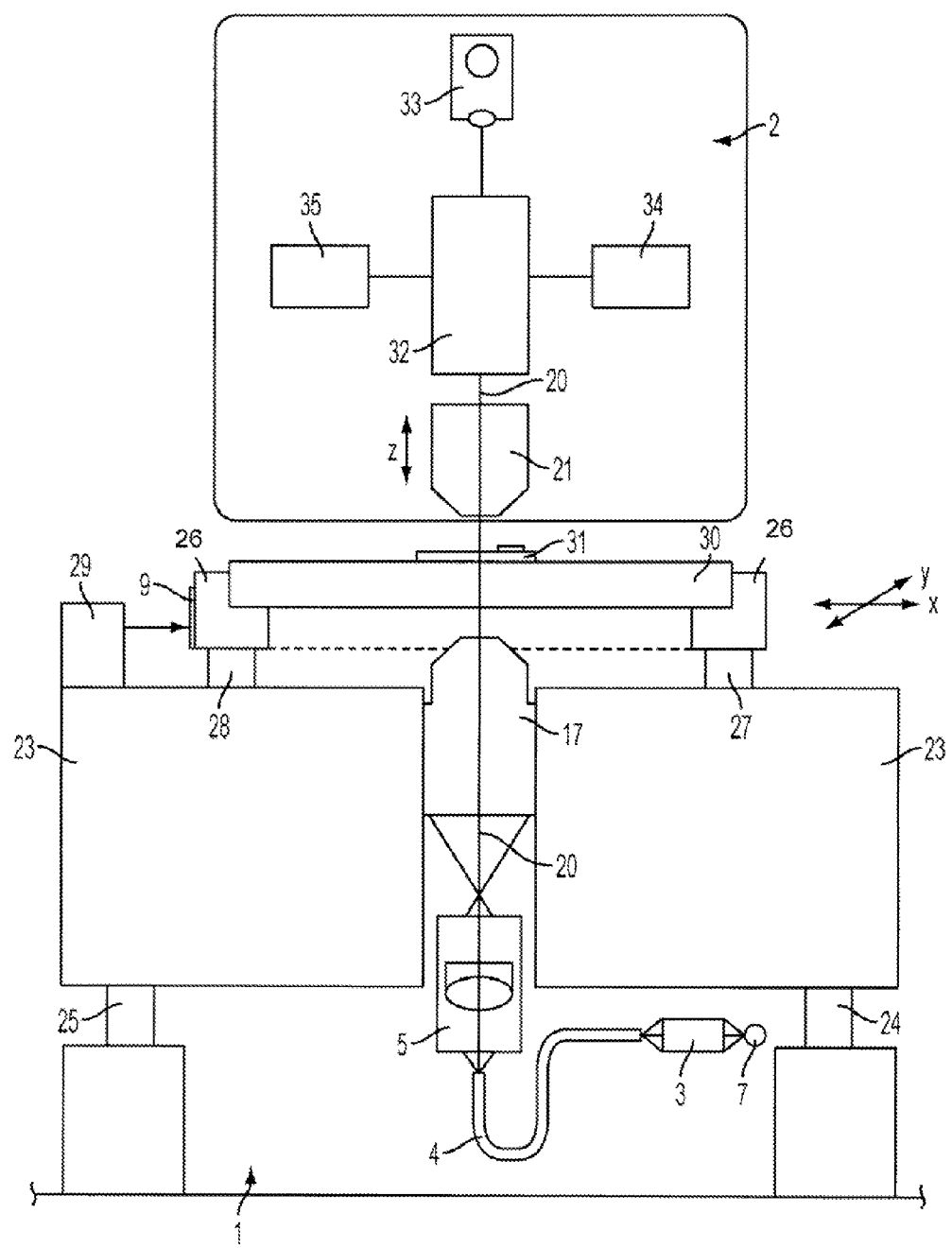
FIG. 1 shows a schematic structure of a coordinate measuring machine where the inventive method is employed.

In the figures, identical reference numerals refer to elements or functional groups that are identical or have essentially the same effect.

As the present invention may be advantageously used in a coordinate measuring device and—without limiting its generality—is mainly described in connection with such a coordinate measuring device, this measuring device will be explained in more detail in the following with reference to the accompanying FIG. 1.

The known measuring device 1 serves for measuring structures 31 and their coordinates on a substrate, such as masks and/or wafers. In the production of semiconductor chips arranged on wafers, the structure widths and the individual structures 31 are becoming smaller and smaller with increasing packing density. Correspondingly, the requirements for the specifications of coordinate measuring devices used as measuring and inspection systems for measuring the edges and their position of the structures 31 and for measuring the structure widths and the overlay are increasing.

The actual coordinate measuring device 1 is schematically shown in FIG. 1. The coordinate measuring device 1 is arranged on a granite block 23 in an antivibration position. The substrates 30 are positioned on the measurement table 26 by an automatic handling system. The measurement table 26 is positioned on air bearings 27, 28 on the surface of the granite block 23. The measurement table 26 is driven by a motor and movable in two dimensions (X-coordinate/Y-coordinate direction). The corresponding drive elements are not shown. Plane mirrors 9 are attached to two sides of the measurement table 26 that are perpendicular to each other. There is a laser interferometer system 29 consisting of two interferometers, one being used for the X-axis and one for the Y-axis. With the laser interferometer system 29, the position of the measurement table 26 is traced and consequently also recorded.

The illumination and the imaging of the structures 31 to be measured is done by a high resolution measurement objective 21 in incident light and/or transmitted light. The detector 34 is advantageously designed as a CCD camera. A measurement window 45 is associated with the CCD chip 40 (see FIG. 2b) of the detector 34. Measurement signals are obtained from the pixels $41_{n,m}$ located within the measurement window 45. By image processing, an intensity profile of the structure currently located within the optical axis 20 of the measurement objective 21 is derived therefrom. Generally, the positions of such structure elements are determined relative to a reference point on the substrate 30 (mask or wafer) or relative to the optical axis 20. Together with the interferometrically measured position of the measurement table 26, this yields the coordinates of the structure and/or the positions of the edges of the structure.

In the example of the coordinate measuring device 1 shown in FIG. 1, the measurement table 26 is designed as a frame so that the sample 30 may be illuminated from below (transmitted light). Above the sample 30, there is the illuminating and imaging means 33 arranged around the optical axis 20. There may be focusing means along the optical axis in the Z-coordinate direction. The focusing means 35 may also be designed as automatic focus means. There may, for example, be provided a glass scale, with which the position of the measurement objective 21 in the Z-coordinate direction may be determined. The illuminating and imaging means 2 consists of a beam splitter module 32, the mentioned detector 34 and an incident light illumination means 33.

Figure 2A:
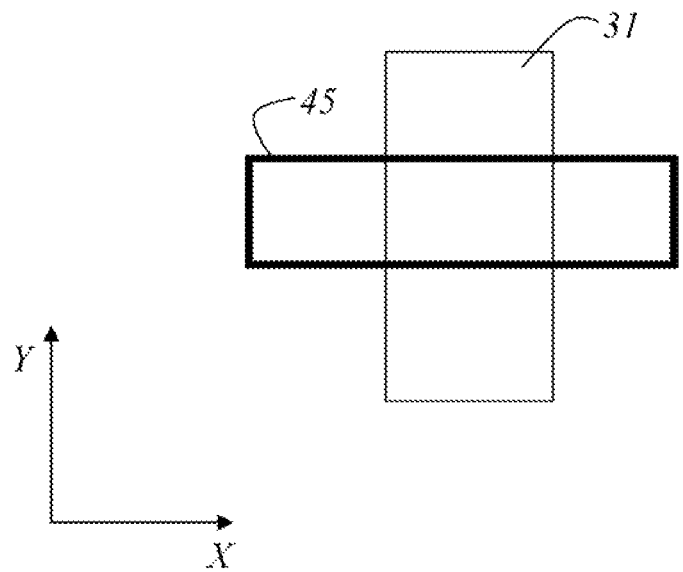
FIG. 2a shows a structure arranged in the X/Y plane with a measurement window of the detector associated therewith.

FIG. 2a shows the association of the measurement window 45 with the structure 31 to be measured. It is obvious for someone skilled in the art that the structure 31 may have any shape. The structure 31 may, for example, include lines, spaces, dots, holes, hammerheads, etc. As shown in FIG. 2a, at least part of the structure 31 is located within the measurement window 45.

Figure 2B:
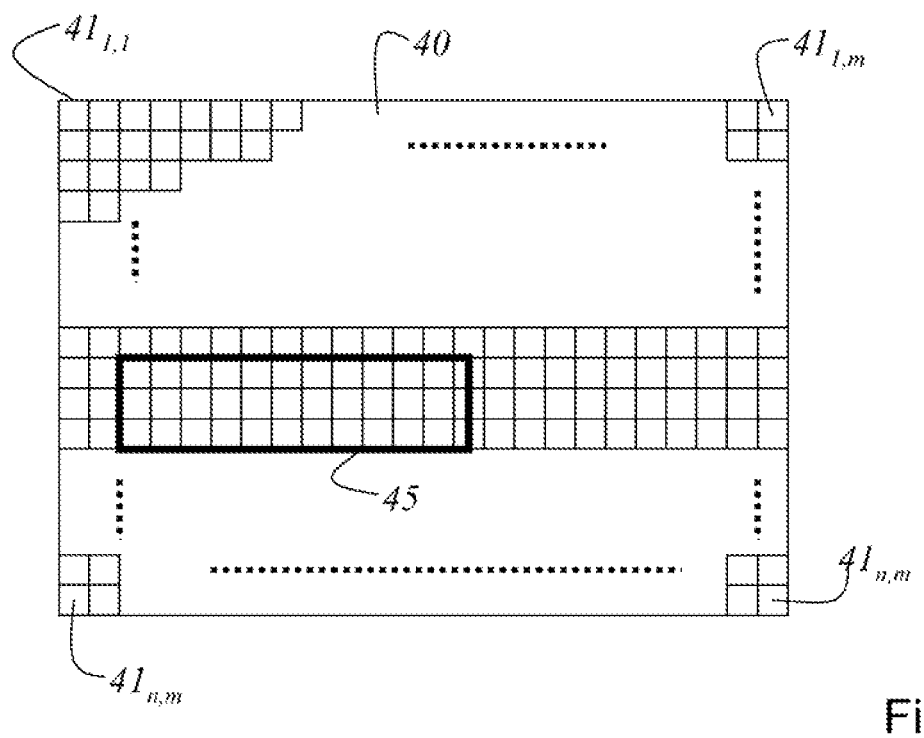
FIG. 2b shows a schematic view of a CCD chip of the detector associated with a measurement window for determining the position of the edges and/or the intensity profiles of the structure.

FIG. 2b shows the arrangement of the measurement window 45 on the CCD chip 40 of the detector used for this measuring device. The CCD chip 40 consists of a plurality of detector elements $41_{1,1}$; $41_{1,2}$ ... $41_{n,m}$, wherein the detector elements are referred to as pixels of the detector and thus form a two-dimensional matrix arrangement. The measurement window 45 itself includes a plurality of pixels of the detector. The measurement window does not have to correspond to an integer number of pixels. For the calculation, there are also used parts of pixel rows n or pixel columns m. What is important is the orientation and/or the angle of the measurement window with respect to the edge. However, the measurement window 45 itself is designed to be smaller than the CCD chip 40. The data determined within the measurement window 45 are supplied to the evaluation by calculating the intensity profile. Corresponding to the orientation of the measurement window, the pixels are summed up column-wise or row-wise to obtain one point of the intensity profile. Non-orthogonal structures are rotated according to their angle. This rotation may be performed both mechanically and by corresponding software algorithms.

Figure 3:
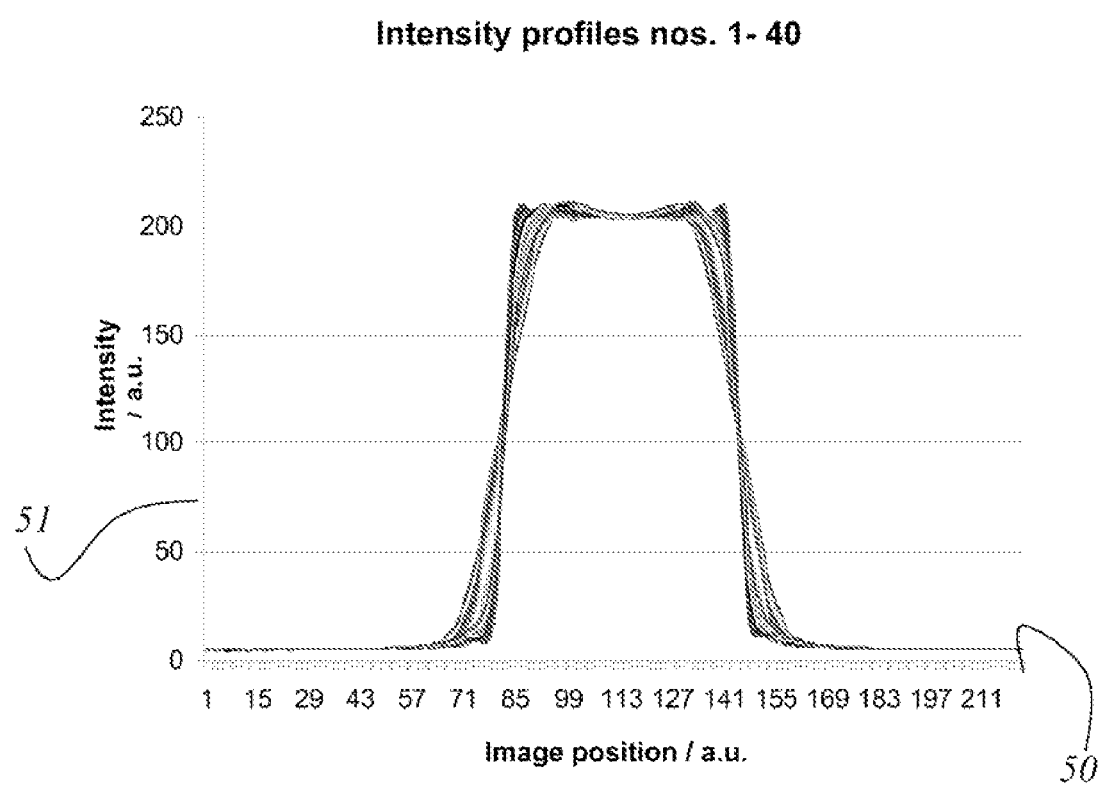
FIG. 3 shows a plot of 40 intensity profiles acquired during the movement of the measurement objective in the Z-coordinate direction around the depth of focus area.

FIG. 3 shows a plot of 40 intensity profiles acquired of a structure 31 on the substrate 30 through the measurement window 45. During the acquisition of the plurality of intensity profiles, the measurement objective 21 was moved in the Z-coordinate direction. The movement of the measurement objective 21 in the Z-coordinate direction is performed such that it covers the depth of focus area during the movement and includes at least one position of the optimal focal position. In FIG. 3, the relative number of the column pixels within the measurement window 45 is exemplarily plotted on the abscissa 50. The intensity of the pixels having this column number, which is measured and summed across the row numbers of the measurement window, is plotted in arbitrary units on the ordinate 51. It is clear that the profiles differ in shape.

Figure 4:
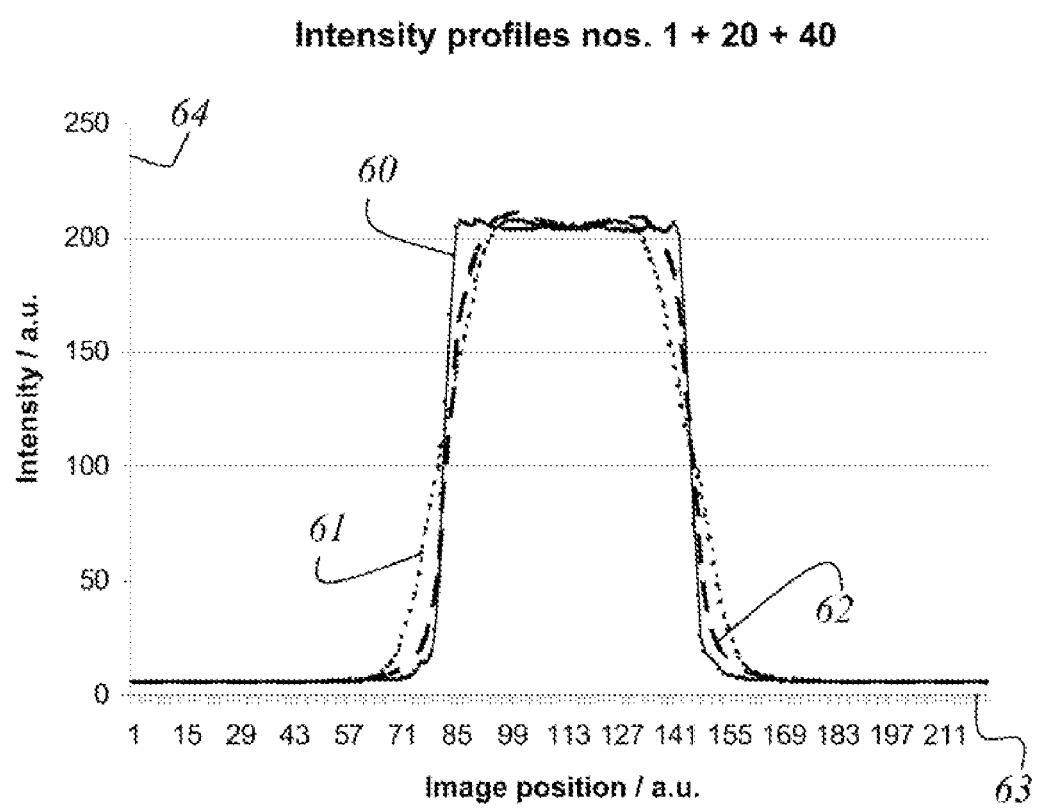
FIG. 4 shows a selection of three intensity profiles of the profiles shown in FIG. 3.

FIG. 4 shows a selection of three profiles of the 40 profiles acquired during the movement of the measurement objective 21 in the Z-coordinate direction. In FIG. 4, the pixel number of the pixel in the measurement window 45 is again plotted on the abscissa 63. The intensity is again plotted in arbitrary units on the ordinate 64. FIG. 4 shows a first profile 60, a second profile 61 and a third profile 62. The first profile is also the first one of the series of 40 acquired profiles. The second profile 61 is the twentieth one of the series of 40 acquired profiles, and the third intensity profile 62 is the fortieth one of the series of acquired profiles. It can be seen that the second intensity profile 61 is the one having the steepest edges.

Figure 5:
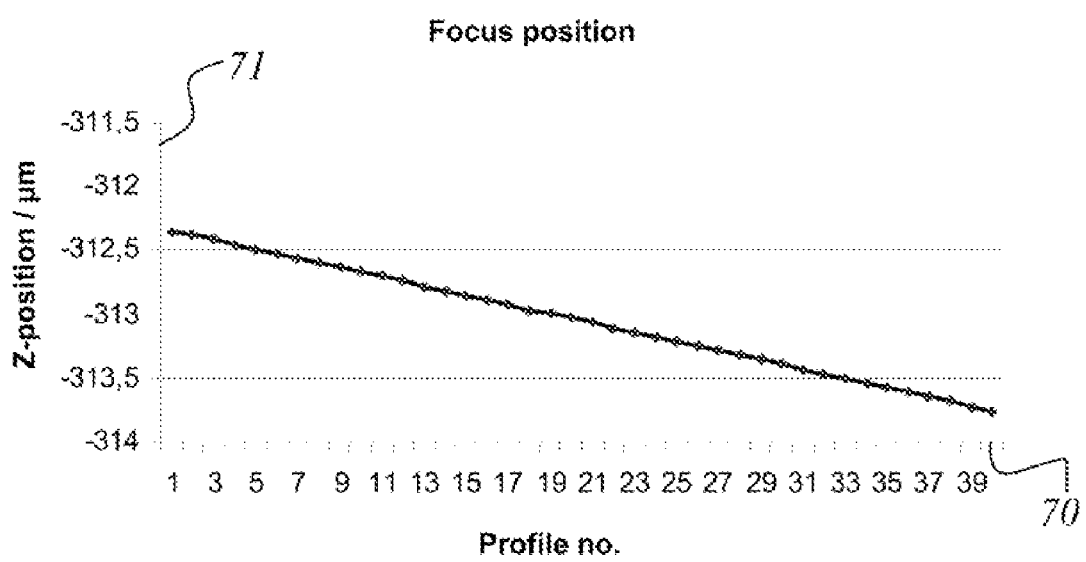
FIG. 5 shows the distribution of the focus position Z of the 40 profiles acquired during the run of the measurement objective in the Z-coordinate direction.

In FIG. 5, the 40 intensity profiles measured in FIG. 3 are plotted as a function of the Z-position of the measurement objective 21. The profile number of the measured intensity profile is plotted on the abscissa 70. The Z-position of the measurement objective 21 at which the corresponding intensity profile of the structure was acquired is plotted on the ordinate 71. FIG. 5 shows that the 40 acquired profiles were acquired in an area of 1.5 µm.

Figure 6A:
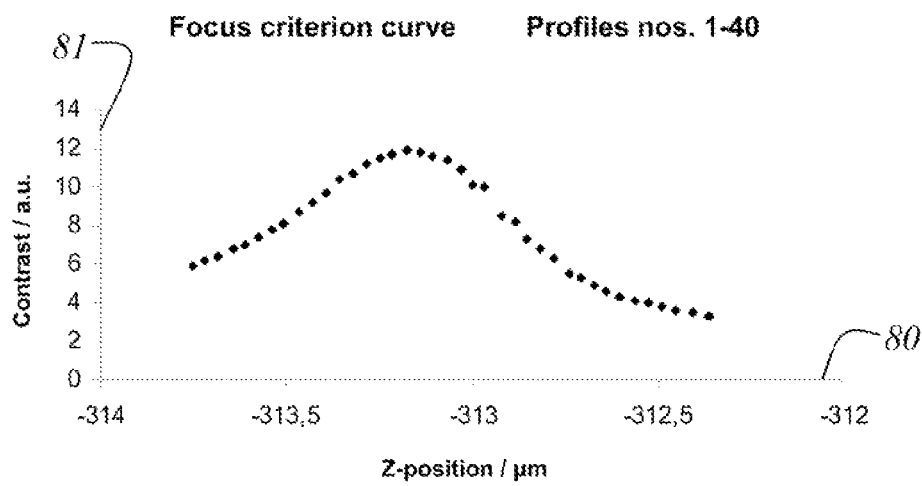
FIG. 6a shows a plot of the distribution of the contrast values as a function of the position of the measurement objective in the Z-coordinate direction.

FIG. 6a shows the Z-position of each acquired intensity profile as a function of the contrast value. The Z-position of the correspondingly acquired intensity profile is plotted on the abscissa 80. The contrast value of the intensity profile acquired at the corresponding position is plotted in arbitrary units on the ordinate 81. FIG. 6a shows clearly that the contrast values vary as a function of the position of the measurement objective 21 in the Z-coordinate direction. Generally the contrast value of the intensity profile is at a maximum the better the focal position.

Figure 6B:
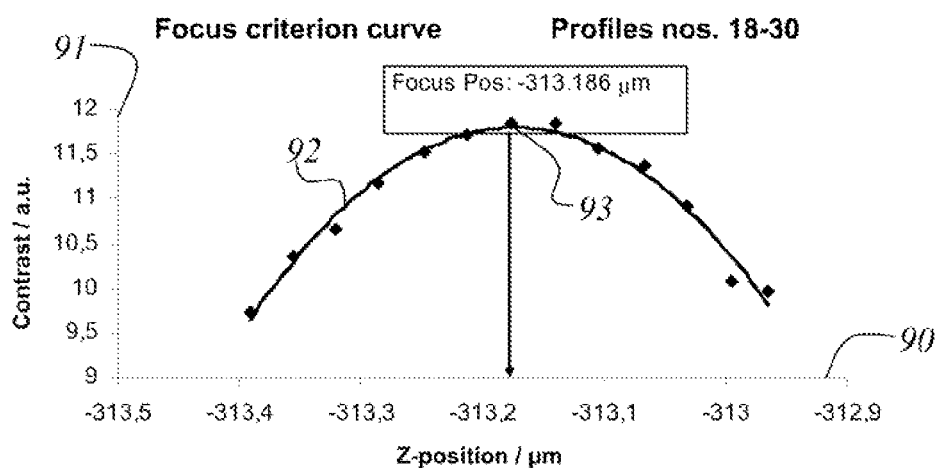
FIG. 6b shows a distribution of the contrast values around the depth of focus area, wherein a function has been fitted to the discrete values by a fit.

FIG. 6b shows the contrast values of some intensity profiles around the area of optimal focus. The Z-position of the measurement objective 21 is again plotted on the abscissa 90. Likewise, the contrast value is plotted in arbitrary units on the ordinate 91. A function 92 is fitted to the discretely determined measurement values for the contrast of the intensity profiles. A maximum examination of the function 92 then yields the position 93 for the optimal focus of the corresponding edge and/or the corresponding intensity profile of the edge. In the present case, the optimal focus is thus at a position of 313.186 µm.

Figure 7:
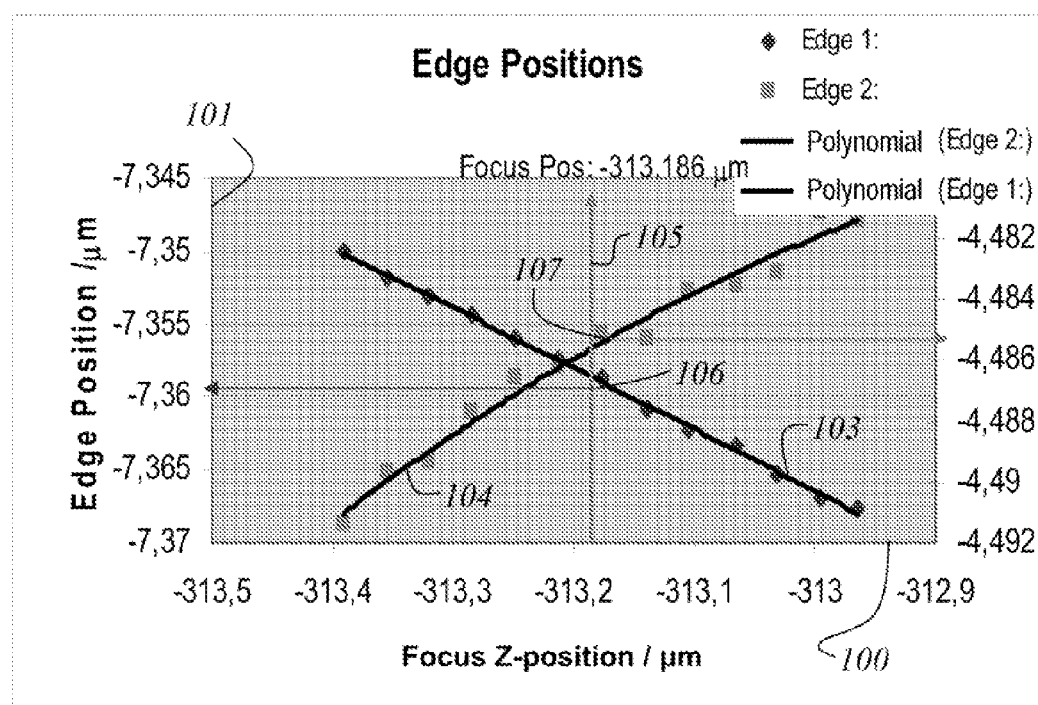
FIG. 7 shows a plot of the determination of the position of the edges from the point of intersection of the functions fitted to the measured values and the value for the optimal focus criterion.

FIG. 7 shows the position of the first edge and the position of the second edge of the structure as a function of the position of the measurement objective in the Z-coordinate direction. The position of the measurement objective in the Z-coordinate direction is again plotted on the abscissa 100. The position for the first edge is plotted on the first ordinate 101. The position of the second edge is plotted on the second ordinate 102. The positions for the first edge and the second edge of the structure are determined by means of discrete measurement values. A first function 103 is fitted to the determined discrete measurement values for the first edge. Likewise, a second function 104 is fitted to the discrete measurement values for the second edge. From the points of intersection of the first function 103 and the second function 104 with the optimal position of the measurement objective 21 in the Z-coordinate direction, points of intersection 106 and 107 are determined giving the position of the first edge and the second edge for the optimal focus 105.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method for determining the focal position of at least two edges of structures on a substrate, comprises the steps of:
   acquiring a plurality of images of the at least one structure with at least one measurement window of a detector during the movement of a measurement objective in the Z-coordinate direction traversing a plane with optimal focus, and determining an intensity profile of the structure for each image:
   determining contrast values for each acquired image and for each edge of the structure located in the measurement window based on the acquired intensity profiles; and
   determining the position of the optimal focus in the Z-coordinate direction at which the contrast is at a maximum from the contrast values for each edge,
   wherein the position of the edge in the image is determined during image acquisition, that at the same time a reference position $(X_0, Y_0)$ in the plane created by the X-coordinate direction and the Y-coordinate direction is determined for each image, and that the edge positions in the image and the reference positions may be added to yield a structure edge position, and
   wherein a functional relationship between the edge positions of the structure and the Z-positions is determined by a fitted function, and wherein the positions of the several edges are each determined by the point of intersection of the position for the optimal focus and the respective functional relationship of the positions of the various edge positions of the structure.

2. The method according to claim 1, wherein the substrate is positioned on a table movable in a plane created by the X-coordinate direction and the Y-coordinate direction.

3. The method according to claim 1, wherein the maximum contrast value and thus the Z-position are determined by an analytic function fitted to the measurement points.

4. The method according to claim 1, wherein the analytic function is determined by a fit to the measurement points, and the Z-position for the optimal focus is determined based on the fit.

5. The method according to claim 4. wherein the fit with which the Z-position is determined at which the concerned structure was in focus is a polynomial fit.

6. The method according to claim 1, wherein the position of the measurement objective in the Z-coordinate direction is measured by means of a glass scale.

7. The method according to claim 1, wherein the position of the measurement objective in the Z-coordinate direction is determined by means of a laser metering system.

8. The method according claim 1, wherein the movement of the measurement objective in the Z-coordinate direction includes a multiple of the depth of focus area of the microscope objective and covers the depth of focus area.

9. The method according to claim 1, wherein at least a first measurement window and at least a second measurement window are provided and the two measurement windows differ in orientation.

10. The method according to claim 1, wherein a position of the at least one edge of at least one structure in the image is determined for each edge of the structure in the measurement window based on the intensity profile.

11. The method according to claim 1, characterized wherein the intensity profiles around the depth of focus area are evaluated such that intensity levels of 0% and 100% are determined.

12. The method according to claim 1, wherein the substrate is a mask or a wafer.

13. The method according to claim 1, wherein the camera is a CCD camera.

* * * * *